United States Patent
Andritschky et al.

(10) Patent No.: US 10,107,524 B2
(45) Date of Patent: *Oct. 23, 2018

(54) METHOD FOR MANUFACTURING THERMAL ABSORBER FOR SOLAR THERMAL COLLECTOR

(75) Inventors: Martin Andritschky, Braga (PT); Kaj A. Pischow, Mikkeli (FI); Luis Manuel Fernandes Rebouta, Braga (PT)

(73) Assignee: SAVOSOLAR OYJ, Mikkeli (FI)

( * ) Notice: Subject to any disclaimer, the term of this patent is extended or adjusted under 35 U.S.C. 154(b) by 930 days.

This patent is subject to a terminal disclaimer.

(21) Appl. No.: 13/985,397

(22) PCT Filed: Feb. 22, 2011

(86) PCT No.: PCT/FI2011/050160
§ 371 (c)(1),
(2), (4) Date: Nov. 1, 2013

(87) PCT Pub. No.: WO2012/113968
PCT Pub. Date: Aug. 30, 2012

(65) Prior Publication Data
US 2014/0048059 A1    Feb. 20, 2014

(51) Int. Cl.
*F24J 2/48* (2006.01)
*F24S 70/20* (2018.01)
*C23C 14/02* (2006.01)
*C23C 14/06* (2006.01)
*C23C 14/56* (2006.01)
(Continued)

(52) U.S. Cl.
CPC ............ *F24S 70/20* (2018.05); *C23C 14/022* (2013.01); *C23C 14/0641* (2013.01); *C23C 14/0676* (2013.01); *C23C 14/35* (2013.01); *C23C 14/568* (2013.01); *F24S 70/25* (2018.05); *Y02E 10/40* (2013.01)

(58) Field of Classification Search
CPC ............ C23C 14/022; F24J 2/24; F24S 70/20
USPC ............................ 126/676, 670; 204/192.28
See application file for complete search history.

(56) References Cited

U.S. PATENT DOCUMENTS

| 4,097,311 A * | 6/1978 | Ishibashi ................. C23C 22/24 |
| | | 126/908 |
| 4,309,261 A | 1/1982 | Harding et al. |
| 2002/0073988 A1 | 6/2002 | Reichert et al. |

(Continued)

FOREIGN PATENT DOCUMENTS

| CN | 101004297 | 7/2007 |
| CN | 101086059 A | 12/2007 |

(Continued)

OTHER PUBLICATIONS

JP Office Action, dated Sep. 15, 2015; Application No. 2013-553973.

(Continued)

*Primary Examiner* — Avinash Savani
*Assistant Examiner* — Aaron Heyamoto
(74) *Attorney, Agent, or Firm* — Young & Thompson

(57) ABSTRACT

A method (100) for manufacturing a thermal absorber for a solar thermal collector includes arranging (120) a substrate of the thermal absorber on a vacuum coating line and depositing (160) by way of a physical vapour deposition on the substrate that is arranged on the vacuum coating line layers configured to absorb light.

15 Claims, 2 Drawing Sheets

(51) Int. Cl.
*C23C 14/35* (2006.01)
*F24S 70/25* (2018.01)

(56) References Cited

U.S. PATENT DOCUMENTS

| | | | | |
|---|---|---|---|---|
| 2006/0139783 | A1* | 6/2006 | Decroupet | C03C 17/36 359/883 |
| 2007/0196670 | A1 | 8/2007 | Barshilia et al. | |
| 2010/0108055 | A1* | 5/2010 | Davis | F24J 2/055 126/663 |
| 2010/0206300 | A1* | 8/2010 | Shabtay | F24J 2/245 126/663 |

FOREIGN PATENT DOCUMENTS

| | | | | |
|---|---|---|---|---|
| CN | 101344334 | A | 1/2009 | |
| DE | 202009015334 | * | 2/2010 | B23K 26/18 |
| DE | 202010010835 | U1 * | 11/2010 | F24J 2/265 |
| EP | 2598811 | | 6/2013 | |
| JP | 57026164 | A | 6/1982 | |
| JP | 5860166 | A | 4/1983 | |
| JP | 2172222 | A | 7/1990 | |
| JP | 2004-205184 | | 7/2004 | |

OTHER PUBLICATIONS

European search report, dated Jul. 24, 2015, in corresponding European Patent Application No. 11 85 9207.
Barshilia, H. et al., "Deposition and characterization of TiAlN/TiAlON/Si3N4 tandem absorbers prepared using reactive direct current magnetron sputtering," Thin Solid Films, vol. 516, No. 18, Jul. 31, 2008, pp. 6071-6078 Abstract.
Translation of Japanese Office Action, dated Sep. 30, 2014, from corresponding JP application.
Sorasahi, V. Presentation [online] in: Cleantech Venture Day, Lahti 1,2,4-6 3-5.11.2010 [retrieved on Sep. 26, 2011], Retrieved from the Internet: <http://www.lahtisbp.fi/easydata/customers/lahtilfiles/cleantech_venture_day2010/sitykseUsavo-solar.pdf> Slides 10, 19,33, and 34, Cited in ISR.
International Search Report, dated Oct. 3, 2011, from corresponding PCT application.
Oct. 5, 2017, EP communication issued for related EP application No. 11859207.0.

* cited by examiner

METHOD FOR MANUFACTURING THERMAL ABSORBER FOR SOLAR THERMAL COLLECTOR

TECHNICAL FIELD

The application relates generally to a method for manufacturing a thermal absorber for a solar thermal collector.

BACKGROUND

Traditional manufacturing method of thermal absorbers of solar collectors starts with a roll-to-roll coating process, wherein flexible and thin substrate material such as copper or aluminium foil is transported continuously through vacuum deposition chambers, wherein it is coated in order to provide selective solar radiation absorbing layers on the substrate material.

After the roll-to-roll coating process, the coated aluminium or copper foil, which delivery form is a coil, is processed for obtaining a thermal absorber having a certain shape and size by opening the coil in order to get a suitable section for removing pieces from the coil, cutting the coated foil to desired foil pieces, and attaching those foil pieces together or with other parts of the thermal absorber such as a cooling fluid tubing. Alternatively, the coil is delivered to a subscriber who processes the coated aluminium or copper foil according to his own needs.

Even though the roll-to-roll process is quite fast, the whole manufacturing process from an uncoated foil to a coated thermal absorber is slow and complex because of several working stages and numerous transfers of uncoated or coated coils from place to another. Furthermore, the attaching process of the metallic foil to the water tubing, e.g. by welding, is expensive, requires sophisticated technology, and connection areas of the thermal absorbers manufactured by such traditional method are prone to failure due to corrosion.

SUMMARY

Therefore, one object of the invention is to withdraw the above-mentioned drawbacks and provide a cheaper and faster manufacturing method especially for rigid or semi-rigid substrates that are used in advanced thermal absorbers of flat plate-type solar thermal collectors.

The object of the invention is fulfilled by providing a method, a thermal absorber, and a solar thermal collector.

According to an embodiment of the invention, a method for manufacturing a thermal absorber for a solar thermal collector that comprises arranging a complete substrate of the thermal absorber on a vacuum coating line and depositing by means of a physical vapour deposition on the complete substrate that is arranged on the vacuum coating line layers configured to absorb light.

The term "thermal absorber" refers to an absorber element comprising at least a coating and it is used for absorbing thermal radiation, e.g. solar radiation. In addition, the absorber element usually comprises a substrate to which the absorber element is provided.

The term "complete substrate" is used in this document to refer to any complete substrate to which a thermal absorber coating is provided. The complete substrate means that the thermal absorber is completed when the substrate has been coated and it is ready to be installed into other structure of a solar thermal collector, i.e. there is no need to further process the coated substrate for obtaining a desired thermal absorber having a certain shape or size but to apply water connection parts if needed. The rigid or flexible substrate can be a metallic or non-metallic substrate, and it can comprise e.g. aluminium, copper, stainless steel, or plastic. The substrate can be formed by one piece or several pieces that are attached together e.g. by welding, soldering, riveting, gluing, screwing, or hot pressing. In addition, the rigid or semi-rigid substrate to be coated can comprise water channels realized e.g. by aluminium or plastic extrusion, metal rolling, and/or other methods to form a direct cooled absorber.

The term "physical vapour deposition" refers to Physical Vapour Deposition process that can comprise e.g. a conventional magnetron sputtering, high power impulse magnetron sputtering, Atomic Layer Deposition, Pulsed Laser Deposition, or Physically Enhanced Chemical Vapour Deposition.

According to an embodiment of the invention, a thermal absorber for a solar thermal collector that comprises a substrate and layers configured to absorb light, wherein the thermal absorber is manufactured by arranging the complete substrate on a vacuum coating line and depositing by means of a physical vapour deposition on the complete substrate that is arranged on the vacuum coating line the layers.

According to an embodiment of the invention, a solar thermal collector that comprises a thermal absorber comprising a substrate and layers configured to absorb light, wherein the thermal absorber is manufactured by arranging the complete substrate on a vacuum coating line and depositing by means of a physical vapour deposition on the complete substrate that is arranged on the vacuum coating line the layers.

Embodiments of the invention methods enable coat advanced thermal absorbers utilising, e.g. the direct flow principle based on different multichannel structures produced with different technologies like rolling, extrusion, and welding from materials like aluminium, copper, stainless steel, or polymers.

The verb "to comprise" is used in this document as an open limitation that neither excludes nor requires the existence of also unrecited features. The verbs "to include" and "to have/has" are defined as to comprise.

The terms "a", "an" and "at least one", as used herein, are defined as one or more than one and the term "plurality" is defined as two or more than two.

The term "another", as used herein, is defined as at least a second or more.

The term "or" is generally employed in its sense comprising "and/or" unless the content clearly dictates otherwise.

For the above-mentioned defined verbs and terms, these definitions shall be applied, unless a different definition is given in the claims or elsewhere in this description/specification.

Finally, the features recited in depending claims are mutually freely combinable unless otherwise explicitly stated.

BRIEF DESCRIPTION OF THE FIGURES

Next, the preferred embodiments of the invention will be described with reference to the accompanying figures, in which.

DETAILED DESCRIPTION OF THE FIGURES

Figure 1:
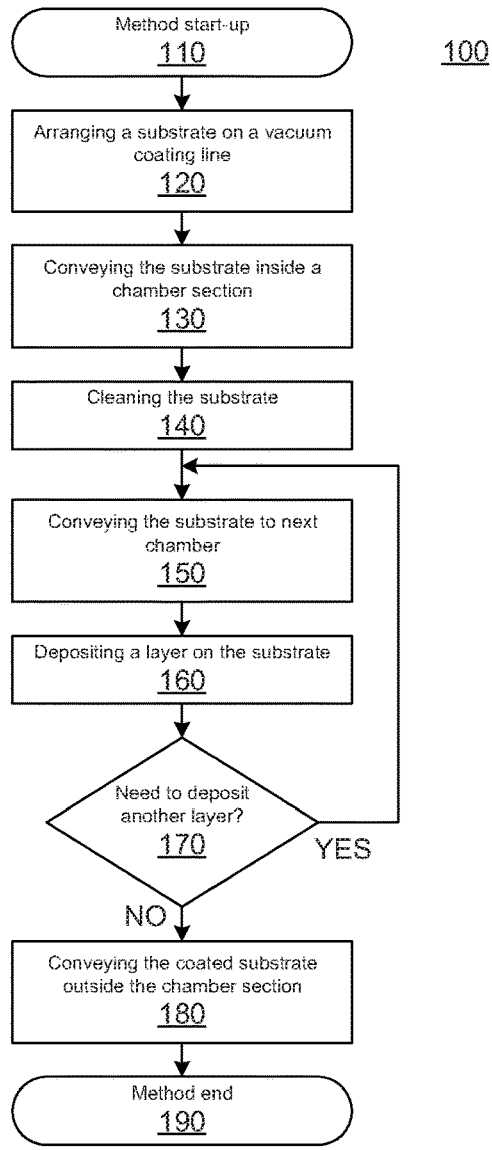
FIG. 1 illustrates an exemplary flowchart of a manufacturing method.

FIG. 1 illustrates a flowchart describing a manufacturing method 100 of a thermal absorber, which is performed by a vacuum coating line.

During the method start-up in step 110, the vacuum coating line is started and necessary actions, e.g. checking and service operations, are made in order to provide that the vacuum coating line works as it should, and a substrate to be coated is prepared, e.g. attaching pieces of a metallic or non-metallic substrate material together so that the rigid or semi-rigid substrate has a desired final shape and size, or picking the substrate up from its package and checking that it is ok. In this step, it is also possible to equip a substrate 320 having water channels 440 inside the substrate body, i.e., direct flow stripes or plate, with end tubes 541, 542, e.g., by soldering, brazing, or welding in order to obtain a direct flow absorber 300 after the coating process has been completed.

Furthermore, during step 110 the prepared substrate is pre-cleaned mechanically and/or chemically so that it is possible to deposit a thermal absorber coating on the complete substrate.

Next, in step 120 the pre-cleaned substrate is lifted on a conveyor of the vacuum coating line that transfers the substrate inside a chamber section of the vacuum coating line that comprises an entrance chamber, three coating chambers, and an exit chamber in step 130.

The substrate firstly arrives in the entrance chamber, wherein a vacuum is pumped and the substrate is further cleaned by plasma ion cleaning during step 140.

According to an embodiment of the invention the method, which is disclosed in any of the previous embodiments, comprises cleaning the complete substrate before the layers are deposited on the complete substrate by plasma ion cleaning in an entrance chamber of the vacuum coating line.

Then, a hatch that isolates the entrance chamber from other part of the chamber section is opened and the further cleaned substrate is conveyed in step 150 from the entrance chamber into a first coating chamber, wherein a first coating layer is deposited during step 160.

The layer, which layer thickness is 10 nm-600 nm, comprises titanium, aluminium, silicon, and nitrogen ($Ti_xAl_ySi_z)N_a$ and it is deposited in vacuum e.g. by magnetron sputtering from a substrate with a composition similar to the composition of the layer to be deposited or by simultaneous sputtering from the three pure element targets in a reactive atmosphere containing nitrogen. Alternatively, yttrium, cerium, or chromium can be used instead of silicon. Indices x, y, z, and a, and later on also index b indicate a stequiometric or non-stequiometric composition of a coating layer. The values of the first layer for x, y, z, and a can be e.g. 0.4, 0.5, 0.1, and 1.0 respectively. Typically, value of x is 0.3-0.5, value of y 0.3-0.6, value of z 0.03-0.2, and value of a 0.9-1.1.

If there are more layers to be deposited in step 170, the method returns back to step 150, wherein the substrate having a first coating layer is conveyed into a second coating chamber, wherein a second layer, i.e. an intermediate layer, is deposited in step 160.

The intermediate layer having layer thickness between 10 nm-150 nm comprises titanium, aluminium, silicon, nitrogen, and oxygen $(Ti_xAl_ySi_z)N_aO_b$. The layer is deposited e.g. by magnetron sputtering from a target with a composition similar to the composition of the intermediate layer to be deposited or by simultaneous sputtering from two or three metallic alloy targets in a reactive atmosphere containing nitrogen and oxygen. The values for x, y, z, a, and b can be e.g. 0.4, 0.5, 0.1, 0.8, and 0.3 respectively. Typically, a value of x is 0.3-0.5, value of y 0.3-0.6, value of z 0.03-0.2, value of a 0.2-0.8, and value of b 0.2-0.8.

If there is still more layers to be deposited in step 170, the method returns back again to step 150 and the substrate having two coating layers is conveyed into a third coating chamber, wherein a third coating layer, i.e. a top layer, is deposited in step 160.

The thickness of the top layer is between 50 nm-250 nm and it comprises titanium, aluminium, silicon, nitrogen, and oxygen $(Ti_xAl_ySi_z)N_aO_b$, where typically a value of x is 0-0.2, value of y 0-0.2, value of z 0-1, value of a 0-2, and value of b 0-2. The top layer is deposited e.g. by magnetron sputtering from a substrate with a composition similar to the composition of the top layer to be deposited or by simultaneous sputtering from several pure element targets in a reactive atmosphere containing nitrogen and oxygen.

According to an embodiment of the invention, the method, which is disclosed in any of the previous embodiments, comprises depositing three layers in coating chambers of a chamber section of the vacuum coating line of which three layers a first layer directly on the complete substrate has a composition comprising titanium, aluminium, nitrogen, and one of following elements: silicon, yttrium, cerium, and chromium; a second layer on the first layer has a composition comprising titanium, aluminium, nitrogen, oxygen and one of following elements: silicon, yttrium, cerium, and chromium; and a third layer on the second layer has a composition that comprises titanium, aluminium, silicon, nitrogen, and oxygen.

Naturally, the completely selectively PVD and/or PECVD coated absorber can be manufactured by using other layer compositions and layer thicknesses, and by depositing different number of layers than it is presented in this example.

When the top layer has been finished and there are no layers to deposit, a hatch between the third coating chamber and the exit chamber is opened and the coated substrate is conveyed into the exit chamber. The hatch is closed for isolating the exit chamber from the coating chambers and the exit chamber is put into an ambient air pressure before the coated substrate is conveyed outside the chamber section in step 180.

According to an embodiment of the invention, the method, which is disclosed in any of the previous embodiments, comprises conveying the complete substrate along the vacuum coating before the complete substrate enters into the chamber section, after the cleaning of the complete substrate and/or one of the depositions of the layers has been provided inside the chamber section, and when the complete substrate exits the chamber section.

Finally, when the deposition process in the vacuum coating line has ended, the coated substrate, i.e. the prepared complete absorber, is removed from the vacuum coating line and the method 100 ends in step 190.

Alternatively, it is also possible to use so-called batch coater as a vacuum coating line in order to produce completely coated absorber, whereupon all the method steps occur in one chamber. Hence, when the method is in step 170 and there are still one or more layers to be deposited, the method returns back to step 160, wherein next layer is deposited on the substrate in the same single chamber. Thus, in the case of the batch coater, there is no need to perform conveying steps 130, 150 and steps 120, 180 concern arranging the substrate to be coated inside the batch-coater and outside the batch-coater respectively.

Figure 2:
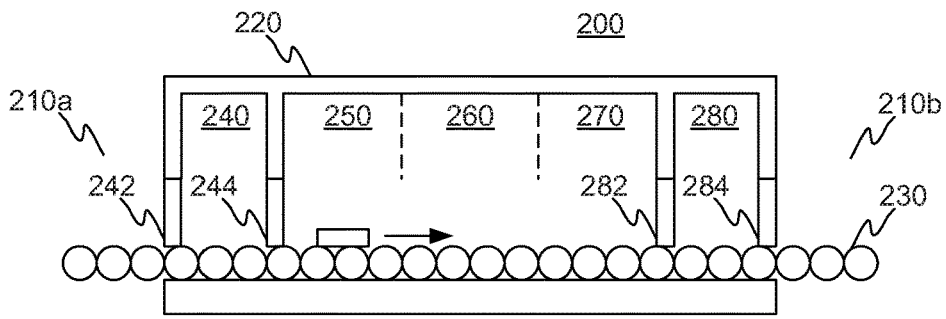
FIG. 2 illustrates an exemplary view of a vacuum coating line that is used for manufacturing a thermal absorber.

In FIG. 2 is illustrated a vacuum coating line 200, wherein conveyor sections 210*a*, 210*b* and a chamber section 220 comprise a conveyor 230, i.e. a roller conveyor, that is adapted to transfer a complete substrate through the vacuum coating line 200. The conveyor 230 can also be a conveyor belt and both cases the whole vacuum coating line 200 is designed so that several substrates can be in line on the conveyor 230 and inside the chamber section 220. A number of substrates that can be set in line depend on sizes of the substrates.

The chamber section 220 comprises an entrance chamber 240 having hatches 242, 244, wherein a vacuum is pumped and the substrate is cleaned by plasma ion cleaning, a first coating chamber 250 having a first magnetron configured to execute magnetron sputtering, a second coating chamber 260 having a second magnetron configured to execute another magnetron sputtering, and a third coating chamber 270 configured to execute a chemical vapour deposition process. There is no hatches between the coating chambers 250, 260, 270, but it is also possible that the coating chambers 250, 260, 270 are separated from each other by additional hatches. At the end of the chamber section 220 locates an exit chamber 280 comprising hatches 282, 284, wherein the substrate is returned to an ambient air pressure.

Inside the coating chambers 250, 260, 270 is a vacuum continuously when the vacuum coating line is switched on, but when the substrate is conveyed from the entrance chamber 240 to the first coating chamber 250, the hatches 242, 244 are closed and the entrance chamber 240 is returned to the ambient air pressure for receiving new substrate to be coated. The same concerns the exit chamber 280 so that when the coated substrate is conveyed from the exit chamber 280 outside the chamber section 220, the hatches 282, 284 are closed and the exit chamber 280 is pumped in vacuum for receiving next coated substrate.

A control unit (not shown) manages the working of the vacuum coating line 200 by means of information provided by sensors installed in the vacuum coating line 200, a computer program run by at least one processor of the control unit, and/or instructions provided by a user through an user interface (not shown) of the vacuum coating line 200. The control unit controls e.g. at least the working of the roller conveyor 230, entrance chamber 240, coating chambers 250, 260, 270, and exit chamber 280. In order to maximize an efficiency of the vacuum coating line 200, the control unit can control the roller conveyor 230 and the chamber section 220 so that one substrate or line of substrates is inside the entrance chamber 240, one substrate or line of substrates is in one of the coating chambers 250, 260, 270, and one substrate or line of substrates is inside the exit chamber 280 at the same time.

Figure 3:
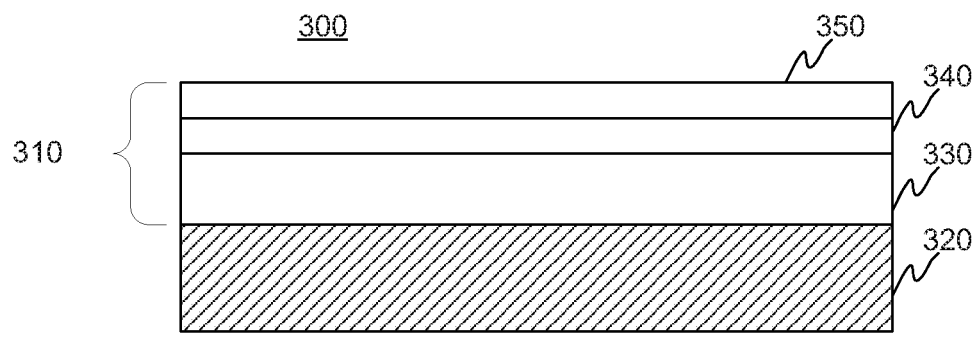
FIG. 3 illustrates an exemplary view of a thermal absorber.

FIG. 3 illustrates a cross-section view of a thermal absorber 300 having a thermal absorber coating 310 on a complete substrate 320 that is manufactured by a vacuum coating line. The complete substrate 320 can comprise prepared water channels inside it.

The multilayer optical coating structure 310 comprises a layer 330 that is firstly deposited directly on a surface of the substrate 320 in order to absorb light and hinder a diffusion of elements from the substrate 320 towards the coating 310 and from an environment towards the substrate 320. An intermediate layer 340 is deposited on the layer 330 for absorbing partially an incident light and enhancing interference at selected wavelengths. A top layer 350 in the coating 310 is provided on the intermediate layer 340 in order to isolate partially the coating 310 from the environmental gases and serve as an antireflection layer. It is possible to design the thermal absorber 300 so that it is the layer 320 that prevents the corrosion of the substrate or, alternatively, the thermal absorber 300 can be designed so that the top layer 350 provides the prevention of the corrosion of the substrate.

According to an embodiment of the invention, the thermal absorber, which is disclosed in any of the previous embodiments, comprises three layers deposited in coating chambers of a chamber section of the vacuum coating line of which three layers a first layer that is deposited directly on the complete substrate has a composition comprising titanium, aluminium, nitrogen, and one of following elements: silicon, yttrium, cerium, and chromium; a second layer that is deposited on the first layer has a composition comprising titanium, aluminium, nitrogen, oxygen and one of following elements: silicon, yttrium, cerium, and chromium; and a third layer that is deposited on the second layer has a composition that comprises titanium, aluminium, silicon, nitrogen, and oxygen.

Figure 4:
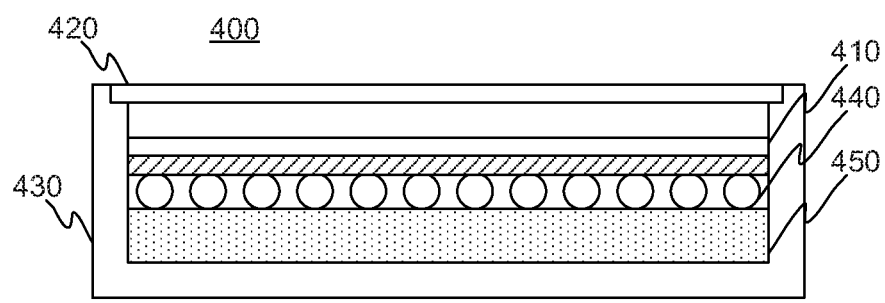
FIG. 4 illustrates an exemplary view of a solar thermal collector.
Figure 5:
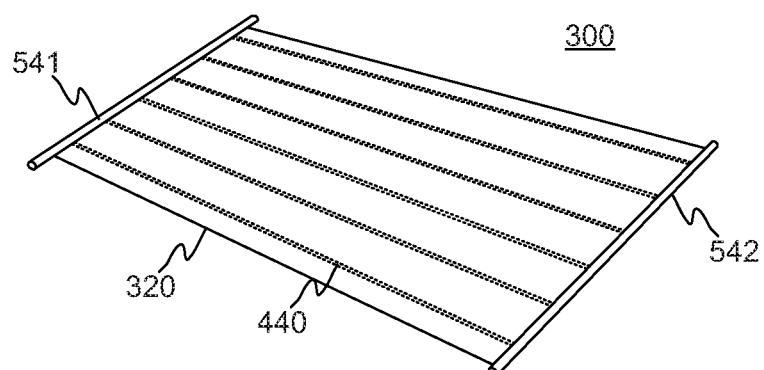
FIG. 5 illustrates a direct flow thermal absorber with end tubes.

FIG. 4 shows a cross-section of a solar thermal collector 400 capable of absorbing solar radiation that comprises a thermal absorber 410 provided in a vacuum coating line.

The flat plate collector 400 has a transparent cover 420, e.g. a glass or polycarbonate cover, which allows the solar radiation to pass to the absorber element 410 and reduces heat loss from the absorber element 410. In addition, the flat plate collector 400 comprises a collector frame 430 that together with the cover 420 shelters the absorber element 410 and tubes 440 connected to the absorber element 410, wherein a heat transport fluid, e.g. air, water, or antifreeze, flows so that absorbed heat is removed from the absorber element 410. The heat transport fluid circulates through the tubes 440 transporting the resulted heat to e.g. a water tank directly in the case of water flowing in the tubes 440. On the bottom of the flat plate collector 400, under the tubes 440 is yet heat insulation 450.

According to an embodiment of the invention, the solar thermal collector, which is disclosed in any of the previous embodiments, comprises the thermal absorber comprising three layers deposited in coating chambers of a chamber section of the vacuum coating line of which three layers a first layer that is deposited directly on the complete substrate has a composition comprising titanium, aluminium, nitrogen, and one of following elements: silicon, yttrium, cerium, and chromium; a second layer that is deposited on the first layer has a composition comprising titanium, aluminium, nitrogen, oxygen and one of following elements: silicon, yttrium, cerium, and chromium; and a third layer that is deposited on the second layer has a composition that comprises titanium, aluminium, silicon, nitrogen, and oxygen.

The invention has been now explained above with reference to the aforesaid embodiments and the several advantages of the invention have been demonstrated. It is clear that the invention is not only restricted to these embodiments, but comprises all possible embodiments within the spirit and scope of the invention thought and the following patent claims.

The invention claimed is:

1. A method for manufacturing a direct flow thermal absorber for a solar thermal collector comprising:
    providing the thermal absorber which comprises a substrate,
a fluid channel structure inside the substrate, and
end tubes that fluidically interconnect the fluid channel structure;
connecting the substrate with the end tubes in order to form a complete structure;
arranging, after connecting the end tubes, the complete substrate of the thermal absorber on a vacuum coating line; and
depositing by means of a physical vapor deposition on the complete substrate, which is arranged on the vacuum coating line layers configured to absorb light,
wherein the complete substrate comprises the fluid channel structure inside the substrate and the end tubes.

2. The method of claim 1, which further comprises cleaning the complete substrate before the layers are deposited on the complete substrate by plasma ion cleaning in an entrance chamber of the vacuum coating line.

3. The method of claim 1, which comprises depositing three layers in coating chambers of a chamber section of the vacuum coating line of which three layers a first layer on the complete substrate has a composition comprising titanium, aluminum, nitrogen, and one of following elements: silicon, yttrium, cerium, and chromium; a second layer on the first layer has a composition comprising titanium, aluminum, nitrogen, oxygen and one of following elements: silicon, yttrium, cerium, and chromium; and a third layer on the second layer has a composition that comprises titanium, aluminum, silicon, nitrogen, and oxygen.

4. The method of claim 1, which further comprises conveying the complete substrate along the vacuum coating line before the complete substrate enters into the chamber section, after the cleaning of the complete substrate or one of the depositions of the layers has been provided inside the chamber section, and when the complete substrate exits the chamber section.

5. A direct flow thermal absorber for a solar thermal collector, manufactured by the method of claim 1 and comprising:
a substrate;
a fluid channel structure inside the substrate;
end tubes that fluidically interconnect the fluid channel structure; and
layers configured to absorb light on the substrate,
wherein the substrate equipped with the end tubes forms a complete substrate of the absorber and
wherein the layers have been deposited on the complete substrate after connection of the end tubes.

6. A solar thermal collector comprising a direct flow thermal absorber manufactured by the method of claim 1 and comprising:
a substrate;
a fluid channel structure inside the substrate;
end tubes that fluidically interconnect the fluid channel structure; and
layers configured to absorb light on the substrate,
wherein the substrate equipped with the end tubes forms a complete substrate of the absorber and
wherein the layers have been deposited on the complete substrate after connection of the end tubes.

7. The method of claim 2, which comprises depositing three layers in coating chambers of a chamber section of the vacuum coating line of which three layers a first layer on the complete substrate has a composition comprising titanium, aluminum, nitrogen, and one of following elements: silicon, yttrium, cerium, and chromium; a second layer on the first layer has a composition comprising titanium, aluminum, nitrogen, oxygen and one of following elements: silicon, yttrium, cerium, and chromium; and a third layer on the second layer has a composition that comprises titanium, aluminum, silicon, nitrogen, and oxygen.

8. The method of claim 2 which further comprises conveying the complete substrate along the vacuum coating line before the complete substrate enters into the chamber section, after the cleaning of the complete substrate or one of the depositions of the layers has been provided inside the chamber section, and when the complete substrate exits the chamber section.

9. The method of claim 3 which further comprises conveying the complete substrate along the vacuum coating line before the complete substrate enters into the chamber section, after the cleaning of the complete substrate or one of the depositions of the layers has been provided inside the chamber section, and when the complete substrate exits the chamber section.

10. The method according to claim 3, wherein the first layer has a thickness of 10 nm-60 nm, the second layer has a thickness of 10 nm-150 nm and the third layer has a thickness of 50 nm-250 nm.

11. The method according to claim 7, wherein the first layer has a thickness of 10 nm-60 nm, the second layer has a thickness of 10 nm-150 nm and the third layer has a thickness of 50 nm-250 nm.

12. The direct flow thermal absorber according to claim 5, wherein the layers comprise:
a first layer on the complete substrate that has a composition comprising titanium, aluminum, nitrogen, and one of following elements: silicon, yttrium, cerium, and chromium;
a second layer on the first layer has a composition comprising titanium, aluminum, nitrogen, oxygen and one of following elements: silicon, yttrium, cerium, and chromium; and
a third layer on the second layer has a composition that comprises titanium, aluminum, silicon, nitrogen, and oxygen.

13. The direct flow thermal absorber according to claim 12, wherein the first layer has a thickness of 10 nm-60 nm, the second layer has a thickness of 10 nm-150 nm and the third layer has a thickness of 50 nm-250 nm.

14. The solar thermal collector according to claim 6, wherein the layers comprise:
a first layer on the complete substrate that has a composition comprising titanium, aluminum, nitrogen, and one of following elements: silicon, yttrium, cerium, and chromium;
a second layer on the first layer has a composition comprising titanium, aluminum, nitrogen, oxygen and one of following elements: silicon, yttrium, cerium, and chromium; and
a third layer on the second layer has a composition that comprises titanium, aluminum, silicon, nitrogen, and oxygen.

15. The solar thermal collector according to claim 14, wherein the first layer has a thickness of 10 nm-60 nm, the second layer has a thickness of 10 nm-150 nm and the third layer has a thickness of 50 nm-250 nm.

* * * * *